US00RE49677E

(19) United States
(12) Reissued Patent
D'Evelyn et al.

(10) Patent Number: US RE49,677 E
(45) **Date of Reissued Patent: *Oct. 3, 2023**

(54) REUSABLE NITRIDE WAFER, METHOD OF MAKING, AND USE THEREOF

(71) Applicant: SLT Technologies, Inc, Los Angeles, CA (US)

(72) Inventors: Mark P. D'Evelyn, Vancouver, WA (US); Michael Ragan Krames, Palo Alto, CA (US)

(73) Assignee: SLT Technologies, Inc, Los Angeles, CA (US)

( * ) Notice: This patent is subject to a terminal disclaimer.

(21) Appl. No.: 17/013,487

(22) Filed: Sep. 4, 2020

Related U.S. Patent Documents

Reissue of:
(64) Patent No.: 10,087,550
Issued: Oct. 2, 2018
Appl. No.: 15/596,728
Filed: May 16, 2017

U.S. Applications:
(63) Continuation of application No. 14/805,278, filed on Jul. 21, 2015, now Pat. No. 9,653,554.
(Continued)

(51) Int. Cl.

| | |
|---|---|
| ***C30B 25/18*** | (2006.01) |
| ***H01L 33/00*** | (2010.01) |
| ***C30B 23/02*** | (2006.01) |
| ***C30B 29/40*** | (2006.01) |
| ***H01L 21/02*** | (2006.01) |
| ***H01L 21/78*** | (2006.01) |
| ***H01L 29/04*** | (2006.01) |

(Continued)

(52) U.S. Cl.
CPC ..... *C30B 25/18* (2013.01); *C30B 23/025* (2013.01); *C30B 29/406* (2013.01); *H01L 21/0254* (2013.01); *H01L 21/7813* (2013.01); *H01L 29/04* (2013.01); *H01L 29/045* (2013.01); *H01L 29/2003* (2013.01); *H01L 29/36* (2013.01); *H01L 31/00* (2013.01); *H01L 31/03044* (2013.01); *H01L 31/1856* (2013.01); *H01L 31/1892* (2013.01); *H01L 33/0075* (2013.01); *H01L 33/0093* (2020.05); *H01L 33/32* (2013.01); *H01S 5/3013* (2013.01); *Y02E 10/544* (2013.01)

(58) Field of Classification Search
None
See application file for complete search history.

(56) References Cited

U.S. PATENT DOCUMENTS

| | | | |
|---|---|---|---|
| 8,247,261 | B2 | 8/2012 | Bedell et al. |
| 9,058,990 | B1 | 6/2015 | Bayram et al. |

(Continued)

*Primary Examiner* — Sean E Vincent
(74) *Attorney, Agent, or Firm* — PATTERSON & SHERIDAN, LLP

(57) ABSTRACT

Techniques for processing materials for manufacture of gallium-containing nitride substrates are disclosed. More specifically, techniques for fabricating and reusing large area substrates using a combination of processing techniques are disclosed. The methods can be applied to fabricating substrates of GaN, AlN, InN, InGaN, AlGaN, and AlInGaN, and others. Such substrates can be used for a variety of applications including optoelectronic devices, lasers, light emitting diodes, solar cells, photo electrochemical water splitting and hydrogen generation, photo detectors, integrated circuits, transistors, and others.

24 Claims, 6 Drawing Sheets

Related U.S. Application Data

(60) Provisional application No. 62/026,777, filed on Jul. 21, 2014.

(51) Int. Cl.

| | |
|---|---|
| ***H01L 29/20*** | (2006.01) |
| ***H01L 29/36*** | (2006.01) |
| ***H01L 31/00*** | (2006.01) |
| ***H01L 31/0304*** | (2006.01) |
| ***H01L 31/18*** | (2006.01) |
| ***H01L 33/32*** | (2010.01) |
| *H01S 5/30* | (2006.01) |

(56) References Cited

U.S. PATENT DOCUMENTS

| | | | | |
|---|---|---|---|---|
| 9,356,188 | B2 | 5/2016 | Paranjpe et al. | |
| 2010/0031875 | A1 | 2/2010 | D'Evelyn | |
| 2011/0256693 | A1* | 10/2011 | D'Evelyn | H01L 29/34 117/73 |
| 2013/0005116 | A1 | 1/2013 | Bedell et al. | |
| 2013/0119401 | A1 | 5/2013 | D'Evelyn et al. | |
| 2013/0126493 | A1 | 5/2013 | Bedell et al. | |
| 2013/0269860 | A1 | 10/2013 | Khayyat et al. | |
| 2014/0034699 | A1 | 2/2014 | Bedell et al. | |
| 2014/0038392 | A1* | 2/2014 | Yonehara | H01L 21/304 438/463 |
| 2014/0065360 | A1 | 3/2014 | D'Evelyn et al. | |
| 2014/0147650 | A1* | 5/2014 | Jiang | H01L 33/0075 |
| 2015/0187888 | A1 | 7/2015 | Paranjpe et al. | |

* cited by examiner

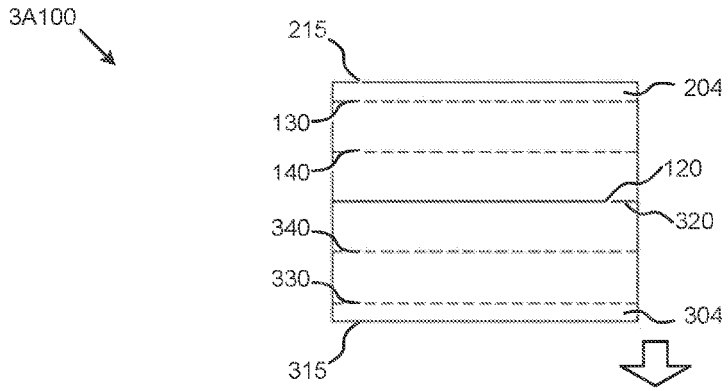
FIG. 3A1
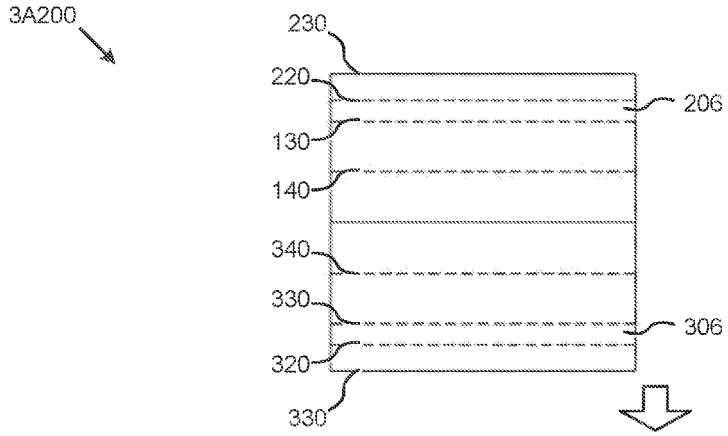
FIG. 3A2
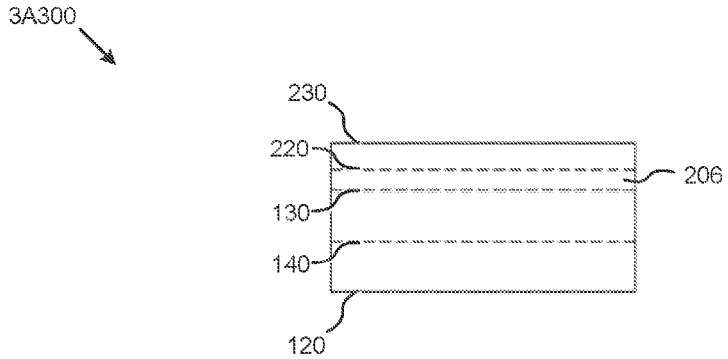
FIG. 3A3

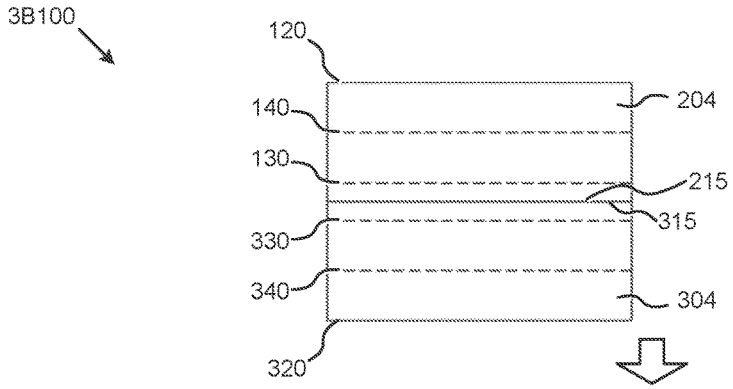
FIG. 3B1
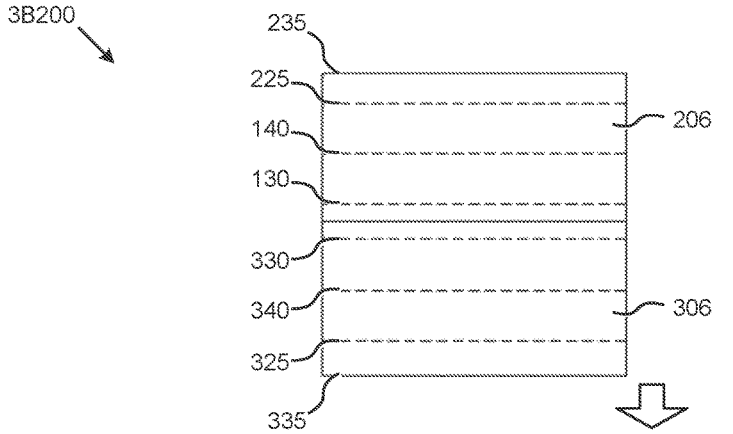
FIG. 3B2
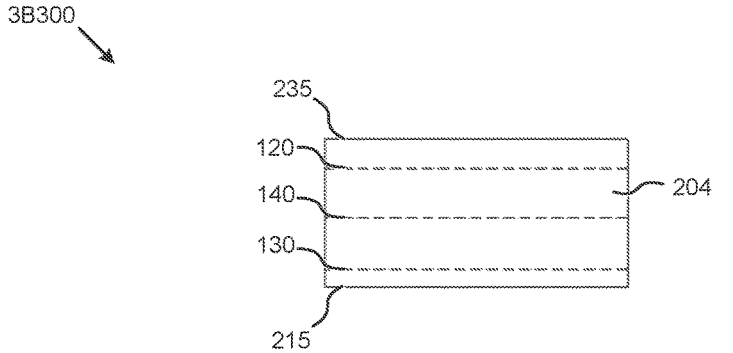
FIG. 3B3

REUSABLE NITRIDE WAFER, METHOD OF MAKING, AND USE THEREOF

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

REFERENCE TO RELATED APPLICATION

This application claims priority to Provisional Application No. 62/026,777, filed Jul. 21, 2014, hereby incorporated by reference.

FIELD

This disclosure relates generally to techniques for processing materials for manufacture of gallium-containing nitride substrates. More specifically, embodiments of the disclosure include techniques for fabricating and reusing large area substrates using a combination of processing techniques.

BACKGROUND

Gallium nitride (GaN)-based optoelectronic and electronic devices are of tremendous commercial importance. The quality and reliability of these devices, however, is compromised by high defect levels, particularly threading dislocations, grain boundaries, and strain in semiconductor layers of the devices. Threading dislocations can arise from a lattice mismatch of GaN-based semiconductor layers to a non-GaN substrate such as sapphire or silicon carbide. Grain boundaries can arise from the coalescence fronts of epitaxially-overgrown layers. Additional defects can arise from thermal expansion mismatch, impurities, and tilt boundaries, depending on the details of the growth of the layers.

The presence of defects has a deleterious effect on epitaxially-grown layers. Such effect includes compromising electronic device performance. To overcome these defects, techniques have been proposed that require complex, tedious fabrication processes to reduce the concentration and/or impact of the defects. While a substantial number of conventional growth methods for gallium nitride crystals have been proposed, limitations still exist. That is, conventional methods still merit improvement to be cost effective and efficient.

Progress has been made in the growth of large-area gallium nitride crystals with considerably lower defect levels than heteroepitaxial GaN layers. However, most techniques for growth of large-area GaN substrates involve GaN deposition on a non-GaN substrate such as sapphire or GaAs. This approach generally gives rise to threading dislocations at average concentrations of $10^5$-$10^7$ $cm^{-2}$ over the surface of thick boules, as well as significant bow, stress, and strain. Reduced concentrations of threading dislocations are desirable for a number of applications. Bow, stress, and strain can cause low yields when slicing the boules into wafers, and can make the wafers susceptible to cracking during downstream processing, and may also negatively impact device reliability and lifetime. Most large area substrates are manufactured by vapor-phase methods such as hydride vapor phase epitaxy (HVPE), which are relatively expensive. Ammonothermal crystal growth has a number of advantages over HVPE as a means for manufacturing GaN boules. However, ammonothermal manufacturing capabilities remain limited and substrate costs to date are higher than HVPE. Flux crystal also has a number of attractive features for growth of large area GaN boules. However, flux manufacturing capabilities remain very limited and GaN substrates synthesized by flux methods are not yet available commercially.

To the extent that nitride substrate costs remain high, particularly for large-area wafers, it would be extremely useful to be able to reuse the wafers so that the net wafer cost is greatly reduced. In addition, alternate means to CMP for removal of subsurface damage is desirable.

From the above, it can be appreciated that techniques for reducing the net usage cost of nitride wafers are highly desirable.

SUMMARY

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The disclosure can be applied to fabricating substrates of GaN, AlN, InN, InGaN, AlGaN, and AlInGaN, and others. Such substrates can be used for a variety of applications including optoelectronic devices, lasers, light emitting diodes, solar cells, photo electrochemical water splitting and hydrogen generation, photo detectors, integrated circuits, transistors, and others.

In one embodiment, gallium-containing nitride wafers are disclosed, comprising a crystalline substrate member having a diameter greater than about 25 millimeters; a substantially wurtzite structure; a first, epi-ready, large-area surface, characterized by a root-mean-square surface roughness less than about 0.5 nanometer measured over an area of 20 micrometers by 20 micrometers, a surface threading density less than about $10^7$ $cm^{-2}$, a stacking-fault concentration below about $10^2$ $cm^{-1}$, and a symmetric x-ray rocking curve full width at half maximum (FWHM) less than about 100 arcsec; a second large-area surface, characterized by a root-mean-square surface roughness less than about 10 micrometers measured over an area of at least 20 micrometers by 20 micrometers; an edge perimeter that is substantially round, with at least one orientation flat; and at least one regrowth interface, wherein the at least one regrowth interface is substantially parallel to the first, epi-ready surface; an average concentration of at least one impurity selected from oxygen, hydrogen, silicon, carbon, fluorine, chlorine, lithium, sodium, and potassium, in a five-micrometer-thick layer on one side of the at least one regrowth interface is higher than an average concentration of the impurity in a five-micrometer-thick layer on an opposite side of the at least one regrowth interface by at least at least five percent and by less than a factor of five; and an average concentration of at least one impurity within a 5 micrometer-thick layer centered at the at least one regrowth interface is greater than an average concentration of the impurity in a five-micrometer-thick layer on opposite sides of the at least one regrowth interface by at least 10 percent and by less than a factor of $10^3$.

In another embodiment, a bulk single-crystal semiconductor wafer is disclosed, comprising: (a) a crystalline substrate member having a thickness between about 100 micrometers and about 10 millimeters, a first surface being epi-ready, and first, second and third layers having first, second and third average impurity concentrations, respectively, wherein the second average impurity concentration is less than the third average impurity concentration, and the first average impurity concentration is greater than both the second and third average impurity concentrations; (b) at least one regrowth interface within the first layer, the regrowth interface being substantially parallel to the first surface and separated from the first surface by a distance of at least 10 micrometers, the regrowth interface having a secondary electron yield higher than that of the material immediately above and below the regrowth interface; (c) the wafer being heatable to at least 950° C. for six hours in an atmosphere consisting essentially of ammonia at a pressure of about 760 Torr without undergoing visible degradation In yet another embodiment, a reusable bulk GaN single-crystal semiconductor wafer is disclosed, comprising: (a) a first layer having a first average impurity concentration; (b) a regrowth interface within the first layer, wherein the regrowth interface has a higher secondary electron yield than that of the material immediately above and below the interface; (c) a second layer having a second average impurity concentration; (d) a third layer having a third average impurity concentration, the first layer lying between the second layer and the third layer; wherein the second average impurity concentration is within a first range of the third average impurity concentration and the first average impurity concentration is within a second range of both the second and third average impurity concentrations.

BRIEF DESCRIPTION OF THE DRAWINGS

FIG. 2A, FIG. 2B, FIG. 2C, FIG. 3A1, FIG. 3A2, FIG. 3A3, FIG. 3B1, FIG. 3B2, and FIG. 3B3 show diagrams illustrating a method of regrowth of one or more spalled wafers according to some embodiments of the present disclosure.

DETAILED DESCRIPTION

According to the present disclosure, techniques related to techniques for processing materials for manufacture and reuse of group-III metal nitride- and gallium-based semiconductor substrates are provided. More specifically, embodiments of the disclosure include techniques for fabricating and reusing large area substrates using a combination of processing techniques. Methods provided by the disclosure can be applied to fabrication and reuse of substrates comprising GaN, AlN, InN, InGaN, AlGaN, and AlInGaN, and others. Such substrates can be used for a variety of applications including optoelectronic devices, lasers, light emitting diodes, solar cells, photo electrochemical water splitting and hydrogen generation, photodetectors, integrated circuits, transistors, and others.

Figure 1A:
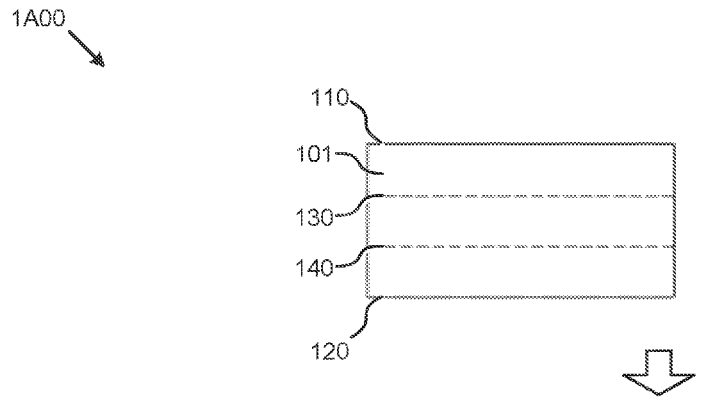
FIG. 1A, FIG. 1B, FIG. 1C and FIG. 1D show diagrams illustrating a method of forming a device layer on a reusable substrate and removing portions of the device layer and of the substrate by spalling according to some embodiments of the present disclosure.

FIG. 1A through FIG. 1D illustrate methods for forming and reuse of a reusable nitride substrate. Referring to FIG. 1A (1A00), a substrate 101 is provided. In certain embodiments, substrate 101 is a semiconductor wafer. In certain embodiments, substrate 101 comprises single-crystalline group-III metal nitride, gallium-containing nitride, or gallium nitride. Substrate 101 may be grown by HVPE, ammonothermally, or by a flux method. One or both of a first large area surface 110 and a second large-area surface 120 of substrate 101 may be polished and/or chemical-mechanically polished. First large-area surface 110 of substrate 101 may have a crystallographic orientation within 5 degrees, within 2 degrees, within 1 degree, or within 0.5 degree of the (0001)+c-plane, (000-1)-c-plane, {10-10} m-plane, {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {10-1±2}, {10-1±3}, {21-3±1}, or {30-3±4}. It will be understood that plane {30-3±4} means the {30-34} plane and the {30-3−4} plane. First surface 110 may have an (h k i 1) semipolar orientation, where i=−(h+k) and 1 and at least one of h and k are non-zero. First surface 110 may have a maximum dimension between about 5 millimeters and about 600 millimeters and a minimum dimension between about 1 millimeter and about 600 millimeters, and substrate 101 may have a thickness between about 10 micrometers and about 10 millimeters, or between about 100 micrometers and about 2 millimeters. In certain embodiments, second surface 120 is lapped or etched. Substrate 101 may comprise a first regrowth interface 130. In certain embodiments, substrate 101 also comprises a second regrowth interface 140. In certain embodiments, substrate 101 comprises one or more additional regrowth interfaces (not shown).

Substrate 101 may have a surface threading dislocation density of less than about $10^8$ $cm^{-2}$, less than about $10^7$ $cm^{-2}$, less than about $10^6$ $cm^{-2}$, less than about $10^5$ $cm^{-2}$, less than about $10^4$ $cm^{-2}$, less than about $10^3$ $cm^{-2}$, or less than about $10^2$ $cm^{-2}$. Substrate 101 may have a stacking-fault concentration below about $10^4$ $cm^{-1}$, below about $10^3$ $cm^{-1}$, below about $10^2$ $cm^{-1}$, below about 10 $cm^{-1}$, or below about 1 $cm^{-1}$. Substrate 101 may have a symmetric x-ray rocking curve full width at half maximum (FWHM) less than about 500 arcsec, less than about 300 arcsec, less than about 200 arcsec, less than about 100 arcsec, less than about 50 arcsec, less than about 35 arcsec, less than about 25 arcsec, or less than about 15 arcsec. Substrate 101 may have a crystallographic radius of curvature greater than 0.1 meter, greater than 1 meter, greater than 10 meters, greater than 100 meters, or greater than 1000 meters in at least one or at least two independent or orthogonal directions.

Substrate 101 may comprise regions having a relatively high concentration of threading dislocations separated by regions having a relatively low concentration of threading dislocations. The concentration of threading dislocations in the relatively high concentration regions may be greater than about $10^5$ $cm^{-2}$, greater than about $10^6$ $cm^{-2}$, greater than about $10^7$ $cm^{-2}$, or greater than about $10^8$ $cm^{-2}$. The concentration of threading dislocations in the relatively low concentration regions may be less than about $10^6$ $cm^{-2}$, less than about $10^5$ $cm^{-2}$, or less than about $10^4$ $cm^{-2}$. Substrate 101 may comprise regions having a relatively high electrical conductivity separated by regions having a relatively low electrical conductivity. Substrate 101 may have a thickness between about 10 microns and about 100 millimeters, or between about 0.1 millimeter and about 10 millimeters, or between about 0.2 millimeters and about 2 millimeters. Substrate 101 may have a dimension, including a diameter, of at least about 5 millimeters, at least about 10 millimeters, at least about 25 millimeters, at least about 50 millimeters, at least about 75 millimeters, at least about 100 millimeters, at least about 150 millimeters, at least about 200 millimeters, at least about 300 millimeters, at least about 400 millimeters, or at least about 600 millimeters.

First surface 110 may have a crystallographic orientation within about 5 degrees of the (0001) Ga-face, c-plane orientation, may have an x-ray diffraction w-scan rocking curve full-width-at-half-maximum (FWHM) less than about 200 arcsec, less than about 100 arcsec, less than about 50 arcsec, or less than about 30 arcsec for the (002) and/or the (102) reflections and may have a dislocation density less than about $10^7$ $cm^{-2}$, less than about $10^6$ $cm^{-2}$, or less than about $10^5$ $cm^{-2}$. In some embodiments, the threading dislocations in first surface 110 are approximately uniformly distributed. In other embodiments, the threading dislocations in first surface 110 are arranged inhomogenously as a one-dimensional array of rows of relatively high- and relatively low-concentration regions or as a two-dimensional array of high dislocation density regions within a matrix of low dislocation density regions. The crystallographic orientation of first surface 110 may be constant to less than about 5 degrees, less than about 2 degrees, less than about 1 degree, less than about 0.5 degree, less than about 0.2 degree, less than about 0.1 degree, or less than about 0.05 degree.

The edge perimeter of substrate 101 may be substantially round, with at least one orientation flat. The edge perimeter of substrate 101 may have a second orientation flat. The edge perimeter of substrate 101 may be beveled, rounded, or chamfered.

Figure 1B:
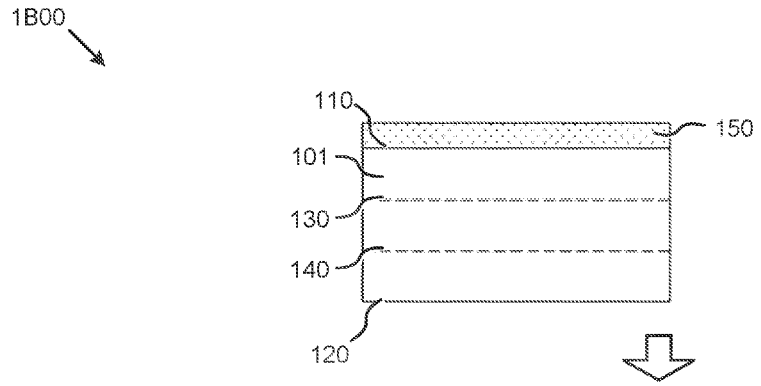

As shown in FIG. 1B, a device structure 150 may be deposited overlying first surface 110. Device structure 150 may comprise at least one semiconductor layer. The semiconductor layer may comprise one or more $Al_xIn_yGa_{(1-x-y)}N$ epitaxial layers, where $0 \leq x, y, x+y \leq 1$. The one or more epitaxial layers may be deposited on the wafer, for example, by metalorganic chemical vapor deposition (MOCVD) or by molecular beam epitaxy (MBE), according to methods that are known in the art. In certain embodiments, the process for deposition of device structure 150 includes exposure of substrate 101 to a temperature between 800 degrees Celsius and 1100 degrees Celsius or between 950 degrees Celsius and 1075 degrees Celsius for a time between 30 minutes and 10 hours or between one hour and six hours in an atmosphere comprising at least one of ammonia, hydrogen, and nitrogen at a pressure between 100 Torr and 1000 Torr. In certain embodiments, the epitaxial layers comprise an n-type layer, an active layer, and a p-type layer, suitable for incorporation into a light-emitting diode (LED) or a laser diode. In certain embodiments, the epitaxial layers comprise a drift layer, with a carrier concentration below about $1\times10^{17}$ $cm^{-3}$, below about $3\times10^{16}$ $cm^{-3}$, or below about $1\times10^{16}$ $cm^{-3}$, suitable for incorporation into a diode or a switch. In certain embodiments, device structure 150 further comprises one or more metallic layers such as n-type contacts, p-type contacts, Schottky contacts, or reflective layers. In certain embodiments, device structure 150 further comprises additional structures such as mesas, streets, or field plates. The device structure may be designed to form a portion of a gallium-nitride-based electronic device or optoelectronic device such as a light emitting diode, a laser diode, a photodetector, an avalanche photodiode, a photovoltaic cell, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, and combinations of any of the foregoing.

Figure 1C:
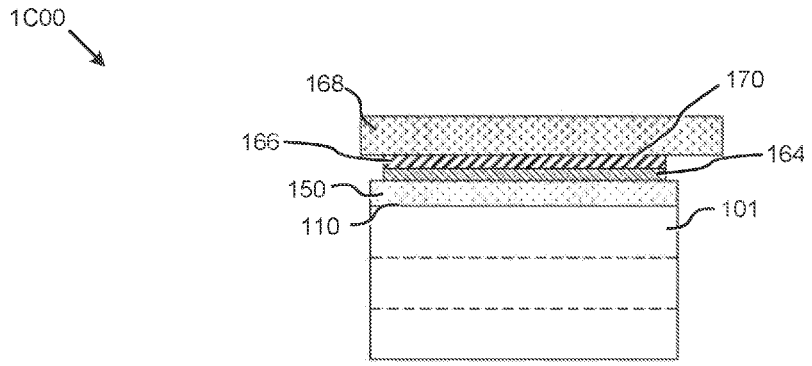

Referring to FIG. 1C, an optional adhesion layer 164 may be deposited overlying device structure 150. Adhesion layer 164 may comprise a metal such as Cr, Ti, or other metals and alloys with excellent adhesion properties. Stressor layer 166 may be deposited overlying device structure 150 and, if present, adhesion layer 164. The nature and thickness of stressor layer 166 is chosen to enable controlled spalling of device structure 150 and an upper portion of substrate 101 according to methods that are known in the art. In particular, the thickness of stressor layer 166 may be chosen to be less than that required for spontaneous spalling (at or about room temperature) but thick enough to permit mechanically assisted spalling using an external load. In certain embodiments stressor layer 166 has approximately the same diameter and surface area as surface 110 and device layer 150. In certain embodiments, the diameter and surface area of stressor layer 166 is chosen to be less than the corresponding values for surface 110 and/or for device layer 150. In a specific embodiment, stressor layer 166 comprises nickel. Flexible handle layer 168 is then attached to surface 170 of stressor layer 166 by means of an adhesive. In one specific embodiment, flexible handle layer 168 comprises a polyimide.

Figure 1D:
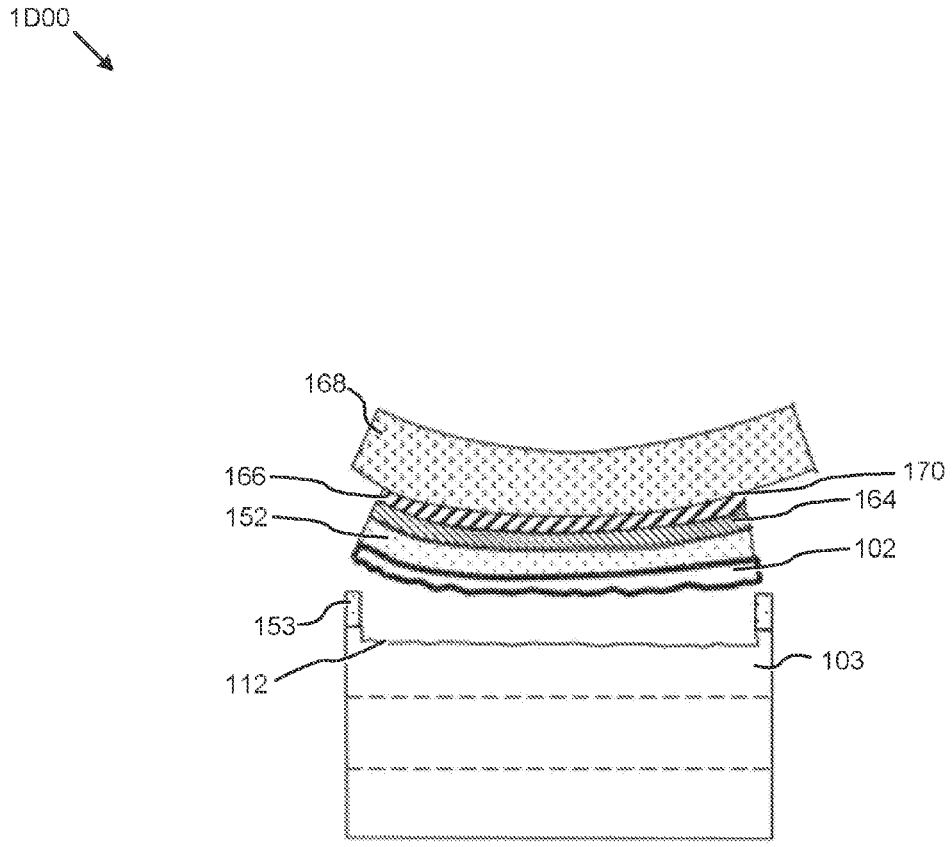

Referring to FIG. 1D, after applying an appropriate load to flexible handle 168, a portion 152 of device layer 150 and a portion 102 of original substrate 101 are removed from spalled substrate 103 by spalling. Substrate portion 102 may have a thickness of at least 10 micrometers, at least 20 micrometers, at least 30 micrometers, at least 40 micrometers, at least 50 micrometers, at least 75 micrometers, or at least 100 micrometers. A portion 153 of device layer 150, for example, along the periphery, may be left behind on spalled substrate 103. Spalling fracture surface 112 on spalled substrate 103 may be somewhat rough, with a root-mean-square roughness greater than 10 nanometers, greater than 30 nanometers, greater than 100 nanometers, greater than 300 nanometers, greater than 1 micrometer, or greater than 3 micrometers. Spalling fracture surface 112 may have a root-mean-square roughness less than about 20 micrometers, less than about 10 micrometers, less than about 3 micrometers, or less than about 1 micrometer.

Spalled device layer 152 may undergo additional processing so as to fabricate one or more electronic or optoelectronic devices such as a light emitting diode, a laser diode, a photodetector, an avalanche photodiode, a photovoltaic cell, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, and combinations of any of the foregoing. Other variations of the controlled spalling process are described in U.S. Pat. No. 8,247,261 and in U.S. Application Publication Nos. 2013/0269860, 2014/0034699, 2013/0005116, and 2013/0126493.

Figure 2A:
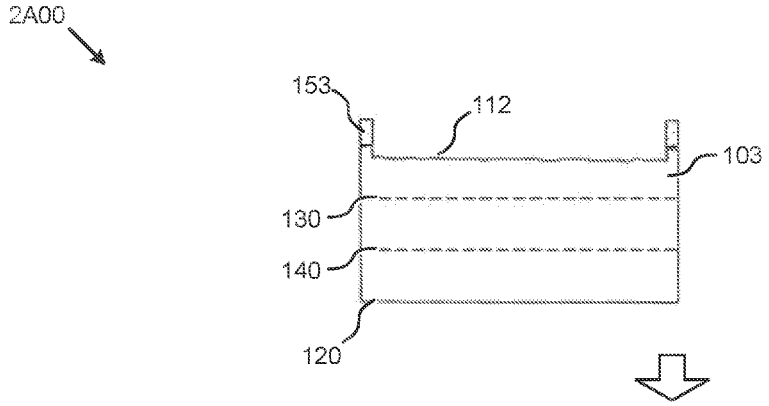
Figure 2B:
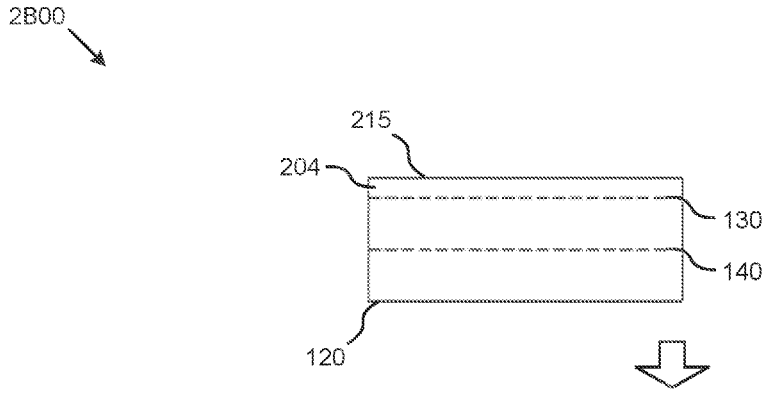

Referring to FIG. 2A, spalled substrate 103 may be prepared for regrowth and reuse. In certain embodiments, residual device layer 153 may be removed by fracture, laser ablation, grinding, lapping, polishing, or the like. In certain embodiments spalled surface 112 is planarized, for example, by one or more of grinding, lapping, polishing, dry etching, and chemical mechanical polishing, forming surface 215 (see FIG. 2B) of planarized substrate 204. In certain embodiments, regrowth interface 130 is still present within planarized substrate 204, whereas in other embodiments it is removed during the planarization operation. In certain embodiments, second surface 120 is ground, lapped, polished, dry etched, and/or chemical-mechanically polished. In certain embodiments, one or more side or edge surfaces of planarized substrate 204 is processed by grinding, lapping, polishing, dry etching, laser scribing, laser cutting, and/or chemical-mechanical polishing. In certain embodiments, one or more surfaces of planarized substrate 204 is etched, for example, in hot aqueous KOH, in hot aqua regia, in hot $H_3PO_4/H_2SO_4$, or the like.

Figure 2C:
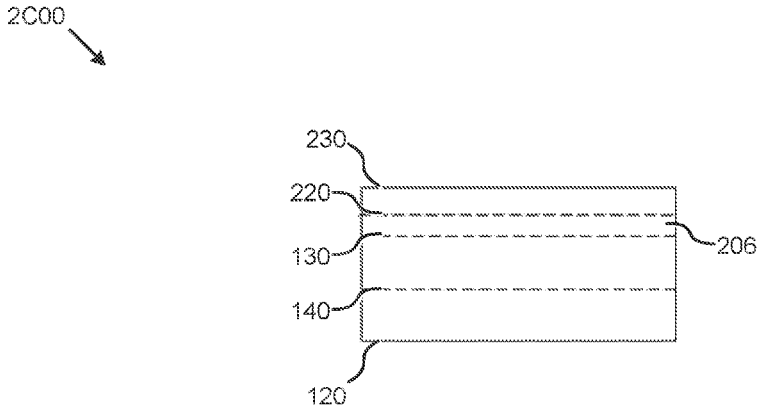

Planarized substrate 204 may then be used as a seed crystal for bulk crystal regrowth. In certain embodiments, regrowth onto planarized surface 215 is performed by hydride vapor phase epitaxy (HVPE), metalorganic chemical vapor deposition (MOCVD), molecular beam epitaxy (MBE), or another vapor-phase growth technique. New regrowth interface 220 (see FIG. 2C) may be present in regrown substrate 206 at a similar separation from second large area surface 120 as that of planarized surface 215 prior to re-growth. In preferred embodiments, the growth conditions are controlled so that the diameter and surface area of regrowth surface 230 are equal to or larger than the diameter and surface area of planarized surface 215. Regrowth surface 230 may be ground, lapped, polished, dry etched, and/or chemical-mechanically polished after the regrowth operation. In certain preferred embodiments, regrowth surface 230 is prepared in an epi-ready state, that is, is ready for epitaxial regrowth, for example, by MOCVD or MBE. In certain embodiments, one or more additional surfaces of regrown substrate 206 are processed. For example, one or more of edge-grinding, beveling, chamfering, flat-grinding, or the like, may be applied.

In certain embodiments, regrowth onto planarized substrate 204 is performed by ammonothermal growth or by flux growth. In certain embodiments, regrowth can be performed most efficiently by causing growth to occur predominantly on just one of planarized surface 215 and second large area surface 120.

In certain embodiments, and as shown in FIG. 3A1, a second planarized substrate 304 is positioned back-to-back with respect to first planarized substrate 204. Second surface 320 of second planarized substrate 304 may be placed in direct contact with second surface 120 of first planarized substrate 204 or may be placed in close proximity, for example, with a separation of less than 3 millimeters, less than 2 millimeters, or less than 1 millimeter. A separator, for example, a thin foil comprising copper, silver, gold, platinum, or the like, may be placed between 120 and 320 to facilitate separation of the two wafers after regrowth. In certain embodiments, second surfaces 120 and 320 are bonded to the separator, for example, by melting and resolidification of a solder, a braze, an Au—Sn eutectic layer, or the like. The bond may undergo additional processing so as to remain unmelted during regrowth conditions. For example, annealing at a temperature below the melting point of the bond may enable diffusion or one or more components of the bond into the separator, significantly raising the melting point of the bond. Second planarized substrate 304 has first planarized surface 315 and may have one or more regrowth interfaces 330, 340.

Back-to-back mounted, planarized substrates 204 and 304 may be supported on a seed rack that is rigid under processing conditions. The seed rack may be placed in a sealable container such as a capsule or an autoclave, along with polycrystalline gallium nitride source material, a mineralizer such as an ammonium halide or an alkali amide, a solvent such as ammonia, and the sealable container may be sealed. The substrates may be processed in a supercritical fluid such as supercritical ammonia, at a temperature greater than about 400 degrees Celsius. In some embodiments the pressure during processing is greater than 50 MPa, greater than 100 MPa, greater than 200 MPa, greater than 300 MPa, greater than 400 MPa, greater than 500 MPa, or greater than 600 MPa. Further details of the growth process may be found in U.S. Application Publication No. 2010/0031875.

Referring again to FIGS. 3A1-3A3, ammonothermal regrowth of back-to-back mounted, planarized substrates 204 and 304 cause formation of new regrowth surfaces 230 and 330 and of new regrowth interfaces 220 and 320 in regrown substrates 206 and 306, with the latter occurring at similar separations from second large-area surfaces 120 and 320 as planarized surfaces 215 and 315, respectively, prior to regrowth. In preferred embodiments, the growth conditions are controlled so that the diameter and surface area of regrowth surfaces 230 and 330 are equal to or larger than the diameter and surface area of planarized surfaces 215 and 315. The thickness of the grown layer (that is, the separation between regrowth surface 230 and regrowth interface 220), is at least 10 micrometers, at least 20 micrometers, at least 30 micrometers, at least 40 micrometers, at least 50 micrometers, at least 75 micrometers, or at least 100 micrometers. Regrown, back-to-back mounted substrates 206 and 306 may be separated for finishing into regrown wafers. A separator, if present, may be removed by dissolution in a mineral acid, for example. Regrowth surfaces 230 and 330 may be ground, lapped, polished, dry etched, and/or chemical-mechanically polished after the regrowth process. In certain preferred embodiments, regrowth surfaces 230 and 330 are prepared in an epi-ready state. As used in the foregoing, an epi-ready state refers to readiness for epitaxial regrowth, for example, by MOCVD or MBE. In certain embodiments, one or more additional surfaces of regrown substrates 206 and 306 are processed. For example, one or more of edge-grinding, beveling, flat-grinding or the like may be applied. Second large-area surfaces 120 and 320, after separation, may be ground, lapped, polished, or the like.

In certain embodiments, as described above and shown in FIGS. 2A-2C and in FIG. 3A1-3A3, regrowth is performed on the same side of the substrate from which a thin layer was removed, for example, by spalling. In other embodiments, regrowth is performed instead on the opposite surface, for example, first large area surface 120 in FIG. 1A. In some embodiments, regrowth on the second large area surface 120 of the wafer is performed by a vapor phase technique such as HVPE, MOCVD, or MBE. In other embodiments, regrowth on second large area surface 120 is performed by ammonothermal growth or by flux growth.

Referring to FIG. 3B1, a second planarized substrate 304 is positioned back-to-back with respect to a first planarized substrate 204. First planarized surface 315 of second planarized substrate 304 may be placed in direct contact with first planarized surface 215 of first planarized substrate 204 or may be placed in close proximity, for example with a separation of less than 3 millimeters, less than 2 millimeters, or less than 1 millimeter. A separator, for example, a thin foil comprising copper, silver, gold, platinum, or the like, may be placed between 215 and 315 to facilitate separation of the two wafers after regrowth. In certain embodiments, first planarized surfaces 215 and 315 are bonded to the separator, for example, by melting and resolidification of a solder, a braze, an Au—Sn eutectic layer, or the like. The bond may undergo additional processing so as to remain unmelted during regrowth conditions. Second planarized substrate 304 has second large area surface 320 and may have one or more regrowth interfaces 330 and 340. Back-to-back mounted, planarized substrates 204 and 304 may be supported on a seed rack that is rigid under processing conditions. The seed rack may be placed in a sealable container such as a capsule or an autoclave, along with polycrystalline gallium nitride source material, a mineralizer such as an ammonium halide or an alkali amide, a solvent such as ammonia, and the sealable container may be sealed. The substrates may be processed in a supercritical fluid such as supercritical ammonia, at a temperature greater than about 400 degrees Celsius.

Referring to FIG. 3B2, ammonothermal regrowth of back-to-back mounted, planarized substrates 204 and 304 causes formation of new regrowth surfaces 235 and 335 and of new regrowth interfaces 225 and 325 in regrown substrates 206 and 306, with the latter occurring at similar separations from planarized surfaces 215 and 315 as second large area surfaces 120 and 320, respectively, prior to regrowth. In preferred embodiments, the growth conditions are controlled so that the diameter and surface area of regrowth surface 235 and 335 are equal to or larger than the diameter and surface area of second large surfaces 120 and 302. The thickness of the grown layer, that is, the separation between regrowth surface 235 and regrowth interface 225, is at least 10 micrometers, at least 20 micrometers, at least 30 micrometers, at least 40 micrometers, at least 50 micrometers, at least 75 micrometers, or at least 100 micrometers. Regrown, back-to-back mounted substrates 206 and 306 may be separated for finishing into a regrown wafer. A separator, if present, may be removed by dissolution in a mineral acid, for example. Regrowth surfaces 235 and 335 may be ground, lapped, and/or polished after the regrowth process. In certain embodiments, one or more additional surfaces of regrown substrates 206 and 306 are processed. For example, one or more of edge-grinding, beveling, flat-grinding or the like may be applied. Planarized surfaces 215 and 315 (see FIG. 3B1) may be ground, lapped, polished, dry etched, and/or chemical-mechanically polished after the regrowth process and after separation. In certain preferred embodiments, planarized surfaces 215 and 315 are prepared in an epi-ready state (e.g., as described above)

Semiconductor wafers are typically prepared by a process that does not leave any regrowth interfaces within the wafer. This is typically achieved by growing boules that are much thicker than the final wafers. Therefore, slicing may be performed through regions that grew continuously during the crystal growth process and regrowth interfaces, if present in the as-grown boule, are removed during the wafering procedure. Regrowth interfaces may cause undesirable stresses that may contribute to cracking or may interfere with electrical or thermal transport through the wafer, and thus are generally regarded as undesirable and to be avoided. In addition, regrowth interfaces may undergo partial decomposition, deterioration, or degration upon heating, for example, to a temperature between 800 degrees Celsius and 1100 degrees Celsius or between 950 degrees Celsius and 1075 degrees Celsius for a time between 30 minutes and 10 hours or between one hour and six hours in an atmosphere comprising at least one of ammonia, hydrogen, and nitrogen at a pressure between 100 Torr and 1000 Torr. However, the present inventors have found conditions for which, surprisingly, the presence of regrowth interfaces within reused wafers according to certain embodiments of the present disclosure are benign, that is, have minor or negligible impact on wafer breakage or electrical or thermal transport while enabling the significant advantage of wafer reusability. These conditions include proper preparation of the wafer surface prior to re-growth and controlling the growth environment so that impurity concentrations in growth crystals are consistent from run to run and minimizing "volatile" impurities that would otherwise lead to highly elevated impurity concentrations directly at the regrowth interfaces. Experiments show that that regrown interfaces can be formed that are benign with respect to wafer performance. In particular, wafers with regrowth interfaces prepared according to the present invention may be heated to a temperature between 800 degrees Celsius and 1100 degrees Celsius or between 950 degrees Celsius and 1075 degrees Celsius for a time between 30 minutes and 10 hours or between one hour and six hours in an atmosphere comprising at least one of ammonia, hydrogen, and nitrogen at a pressure between 100 Torr and 1000 Torr without forming cracks or undergoing significant deterioration or decomposition, such as formation of voids, bubbles, or domains of gallium metal. As used herein, visible degradation means any known sign of deterioration from heat including formation of cracks, voids, bubbles, or metallic domains that can be seen visually by the naked eye and/or under no more than 200× magnification using an optical microscope.

Figure 4:
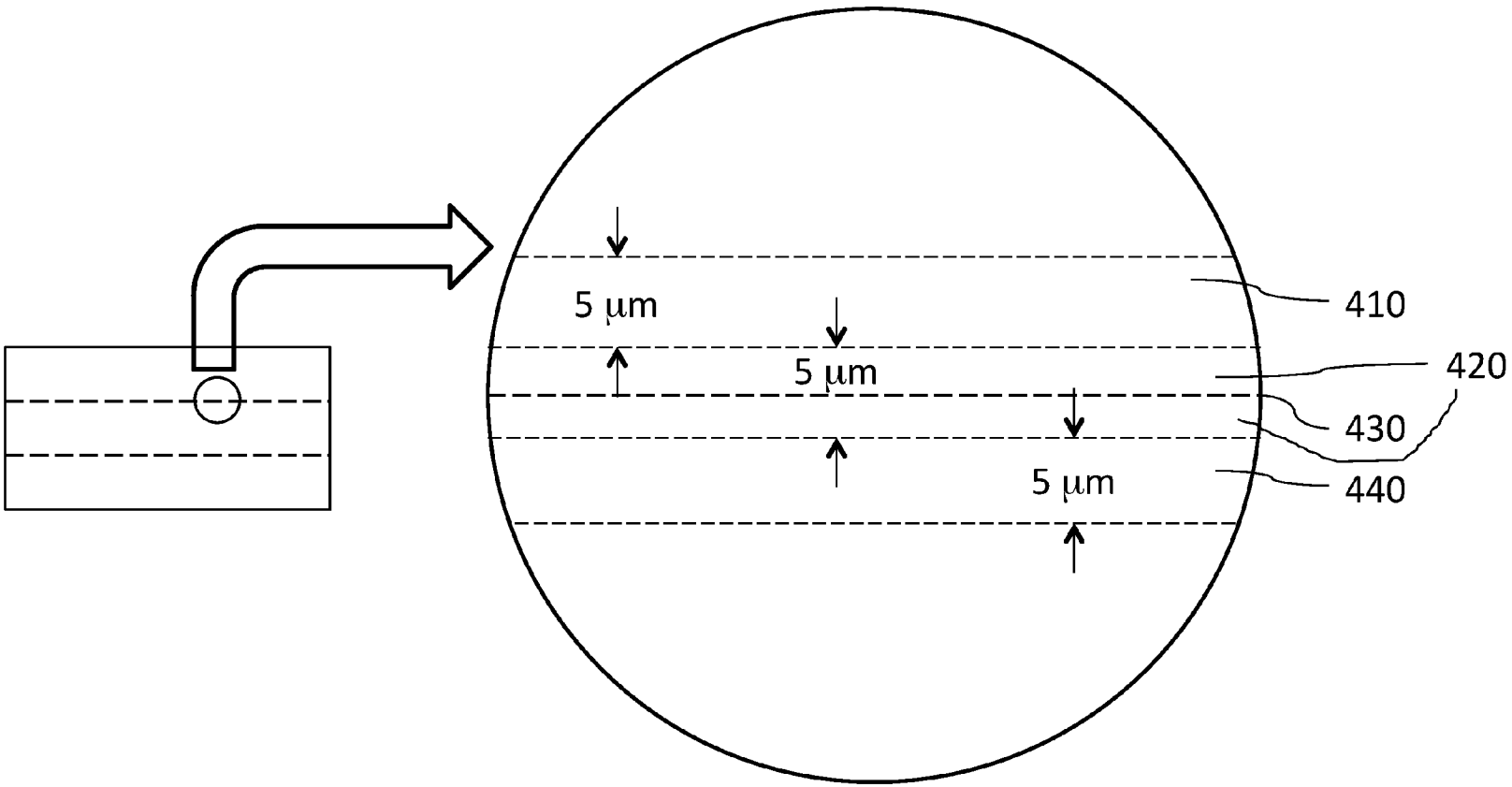
FIG. 4 shows a diagram illustrating the vicinity of a regrowth interface within a reusable substrate.

In certain embodiments of the present disclosure, one or more regrowth interfaces are present within epi-ready wafers. The regrowth interfaces are characterized by slightly different impurity concentrations on one side of the interface than on the other side of the interface, and by impurity concentrations that are slightly elevated at the interface itself, that is, within a thickness of approximately 50 nanometers to about 5 micrometers of the interface. Referring to FIG. 4, in certain embodiments, the average concentration of at least one impurity, selected from among oxygen, hydrogen, silicon, carbon, fluorine, chlorine, lithium, sodium, and potassium, in a five-micrometer-thick layer 410 on one side of the regrowth interface 430, is higher than the average concentration of that same impurity in a five-micrometer-thick layer 440 on the opposite side of the regrowth interface by at least 1 percent, at least 2 percent, at least 5 percent, or at least 10 percent and by less than a factor of five, less than a factor of two, or by less than fifty percent. In certain embodiments, the average concentration of at least one impurity, selected from among oxygen, hydrogen, silicon, carbon, fluorine, chlorine, lithium, sodium, and potassium, within a five-micrometer-thick layer 420 centered at the regrowth interface is greater than the average concentration of that same impurity in five-micrometer-thick layers 410 and 440 on opposite sides of the regrowth interface by at least 10 percent, at least 20 percent, at least 50 percent, at least a factor of two, at least a factor of five, or at least a factor of ten and by less than a factor of $10^4$, less than a factor of $10^3$, or less than a factor of 100. In certain embodiments, the regrowth interface has a higher secondary electron yield than the layers immediately above or below, so that it appears as a bright light upon viewing as a cross section in a secondary electron microscope (SEM). In certain embodiments, a five-micrometer-thick layer 420 centered at the regrowth interface is characterized by impurity concentrations of O, H, C, Na, K, F, and Cl between about $1\times10^{16}$ $cm^{-3}$ and $1\times10^{19}$ $cm^{-3}$, between about $1\times10^{16}$ $cm^{-3}$ and $2\times10^{19}$ $cm^{-3}$, below $1\times10^{17}$ $cm^{-3}$, below $2\times10^{18}$ $cm^{-3}$, below $2\times10^{18}$ $cm^{-3}$, below $2\times10^{17}$ $cm^{-3}$, and below $2\times10^{17}$ $cm^{-3}$, respectively, as quantified by calibrated secondary ion mass spectrometry (SIMS).

The reused nitride wafer may have a large-area crystallographic orientation within 5 degrees, within 2 degrees, within 1 degree, within 0.5 degree, within 0.2 degree, within 0.1 degree, within 0.05 degree, within 0.02 degree, or within 0.01 degree of (0001)+c-plane, (000-1) −c-plane, {10-10} m-plane, {11−20} a-plane, {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {10-1±2}, {10-1±3}, {21-3±1}, or {30-3±4}. The reused nitride wafer may have an (h k i 1) semipolar large-area surface orientation, where i=−(h+k) and 1 and at least one of h and k are non-zero.

In certain embodiments, a large-area surface of the reused nitride wafer has a crystallographic orientation that is miscut from the (0001)+c-plane by between about 0.2 degrees and about 1 degree toward a <10-10> m-direction and by less than 1 degree toward an orthogonal <11-20> a-direction. In certain embodiments, a large-area surface of the reused nitride wafer has a crystallographic orientation that is miscut from {10-10} m-plane by between about −60 degrees and about +60 degrees toward [0001] +c-direction and by up to about 10 degrees toward an orthogonal <1-210> a-direction. In certain embodiments, a large-area surface of the reused nitride wafer has a crystallographic orientation that is miscut from {10-10} m-plane by between about −30 degrees and about +30 degrees toward [0001] +c-direction and by up to about 5 degrees toward an orthogonal <1-210> a-direction. In certain embodiments, a large-area surface of the reused nitride wafer has a crystallographic orientation that is miscut from {10-10} m-plane by between about −5 degrees and about +5 degrees toward [0001] +c-direction and by up to about 1 degree toward an orthogonal <1-210> a-direction. The reused nitride wafer may have a stacking fault concentration below $10^2$ $cm^{-1}$, below 10 $cm^{-1}$, or below 1 $cm^{-1}$, and a very low dislocation density, below about $10^5$ $cm^{-2}$, below about $10^4$ $cm^{-2}$, below about $10^3$ $cm^{-2}$, below about $10^2$ $cm^{-2}$, or below about 10 $cm^{-2}$ on one or both of the two large area surfaces.

The reused nitride wafer may have a symmetric x-ray rocking curve full width at half maximum (FWHM) less than about 200 arcsec, less than about 100 arcsec, less than about 50 arcsec, less than about 35 arcsec, less than about 25 arcsec, or less than about 15 arcsec. The reused nitride wafer may have a crystallographic radius of curvature greater than 0.1 meter, greater than 1 meter, greater than 10 meters, greater than 100 meters, or greater than 1000 meters, in at least one, at least two, or in three independent or orthogonal directions.

In certain embodiments, at least one surface of the reused nitride wafer has atomic impurity concentrations of at least one of oxygen (O) and hydrogen (H) above about $1\times10^{16}$ $cm^{-3}$, above about $1\times10^{17}$ $cm^{-3}$, or above about $1\times10^{18}$ $cm^{-3}$. In certain embodiments, a ratio of the atomic impurity concentration of H to the atomic impurity concentration of 0 is between about 1.1 and about 1000, or between about 5 and about 100. In certain embodiments, at least one surface of the reused nitride wafer has impurity concentrations of at least one of lithium (Li), sodium (Na), potassium (K), fluorine (F), chlorine (CO, bromine (Br), or iodine (I) above about $1\times10^{15}$ $cm^{-3}$, above about $1\times10^{16}$ $cm^{-3}$, above about $1\times10^{17}$ $cm^{-3}$, or above about $1\times10^{18}$ $cm^{-3}$. In certain embodiments, the top and bottom surfaces of the reused nitride wafer may have impurity concentrations of O, H, carbon (C), Na, and K between about $1\times10^{16}$ $cm^{-3}$ and $1\times10^{19}$ $cm^{-3}$, between about $1\times10^{16}$ $cm^{-3}$ and $2\times10^{19}$ $cm^{-3}$, below $1\times10^{17}$ $cm^{-3}$, below $1\times10^{16}$ $cm^{-3}$, and below $1\times10^{16}$ $cm^{-3}$, respectively, as quantified by calibrated secondary ion mass spectrometry (SIMS). In another embodiment, the top and bottom surfaces of the reused nitride wafer may have impurity concentrations of O, H, C, and at least one of Na and K between about $1\times10^{16}$ $cm^{-3}$ and $1\times10^{19}$ $cm^{-3}$, between about $1\times10^{16}$ $cm^{-3}$ and $2\times10^{19}$ $cm^{-3}$, below $1\times10^{17}$ $cm^{-3}$, and between about $3\times10^{15}$ $cm^{-3}$ and $1\times10^{18}$ $cm^{-3}$, respectively, as quantified by calibrated secondary ion mass spectrometry (SIMS). In still another embodiment, the top and bottom surfaces of the reused nitride wafer may have impurity concentrations of O, H, C, and at least one of F and Cl between about $1\times10^{16}$ $cm^{-3}$ and $1\times10^{19}$ $cm^{-3}$, between about $1\times10^{16}$ $cm^{-3}$ and $2\times10^{19}$ $cm^{-3}$, below $1\times10^{17}$ $cm^{-3}$, and between about $1\times10^{15}$ $cm^{-3}$ and $1\times10^{17}$ $cm^{-3}$, respectively, as quantified by calibrated secondary ion mass spectrometry (SIMS). In some embodiments, the top and bottom surfaces of the reused nitride wafer have impurity concentrations of C below $5\times10^{16}$ $cm^{-3}$, below $2\times10^{16}$ $cm^{-3}$, or below $1\times10^{16}$ $cm^{-3}$. In some embodiments, the top and bottom surfaces of the reused nitride wafer may have impurity concentrations of H between about $5\times10^{17}$ $cm^{-3}$ and $1\times10^{19}$ $cm^{-3}$, as quantified by calibrated secondary ion mass spectrometry (SIMS). In certain embodiments, at least one surface of the reused nitride wafer has an impurity concentration of copper (Cu), manganese (Mn), and iron (Fe) between about $1\times10^{16}$ $cm^{-3}$ and $1\times10^{19}$ $cm^{-3}$. In a specific embodiment, the free-standing ammonothermal group III metal nitride boule or wafer has an infrared absorption peak at about 3175 $cm^{-1}$, with an absorbance per unit thickness of greater than about 0.01 $cm^{-1}$.

The reused nitride wafer may be characterized by a wurtzite structure substantially free from any cubic entities or other crystal structures, the other structures being less than about 0.1% in volume in reference to the substantially wurtzite structure.

A reused nitride wafer may be characterized by a total thickness variation (TTV) of less than about 25 micrometers, less than about 10 micrometers, less than about 5 micrometers, less than about 2 micrometers, or less than about 1 micrometer, and by a macroscopic bow that is less than about 200 micrometers, less than about 100 micrometers, less than about 50 micrometers, less than about 25 micrometers, or less than about 10 micrometers. A large-area surface of the reused nitride wafer may have a concentration of macro defects, with a diameter or characteristic dimension greater than about 100 micrometers, of less than about 2 $cm^{-2}$, less than about 1 $cm^{-2}$, less than about 0.5 $cm^{-2}$, less than about 0.25 $cm^{-2}$, or less than about 0.1 $cm^{-2}$. The variation in a miscut angle across a large-area surface of the reused nitride wafer may be less than about 5 degrees, less than about 2 degrees, less than about 1 degree, less than about 0.5 degree, less than about 0.2 degree, less than about 0.1 degree, less than about 0.05 degree, or less than about 0.025 degree in each of two orthogonal crystallographic directions. The root-mean-square surface roughness of a first, epi-ready, large-area surface of the reused nitride wafer, as measured over an area of at least 20 μm×20 μm, may be less than about 0.5 nanometer, less than about 0.2 nanometer, less than about 0.15 nanometer, less than about 0.1 nanometer, or less than about 0.10 nanometer. The root-mean-square surface roughness of a second large-area surace of the reused nitride wafer, as measured over an area of at least 20 μm×20 μm, may be less than about 10 micrometers, less than about 3 micrometers, less than about 1 micrometer, less than about 300 nanometers, or less than about 100 nanometers. The reused nitride wafer may be characterized by n-type electrical conductivity, with a carrier concentration between about $1\times10^{17}$ $cm^{-3}$ and about $3\times10^{19}$ cm−3 and a carrier mobility greater than about 100 $cm^2$/V-s. In alternative embodiments, the reused nitride wafer is characterized by p-type electrical conductivity, with a carrier concentration between about $1\times10^{15}$ $cm^{-3}$ and about $1\times10^{19}$ $cm^{-3}$. In still other embodiments, the reused nitride wafer is characterized by semi-insulating electrical behavior, with a room temperature resistivity greater than about $10^7$ Ω-centimeter, greater than about $10^8$ Ω-centimeter, greater than about $10^9$ Ω-centimeter, greater than about $10^{10}$ Ω-centimeter, or greater than about $10^{11}$ Ω-centimeter. In certain embodiments, the reused nitride wafer is highly transparent, with an optical absorption coefficient at a wavelength of 400 nanometers that is less than about 10 $cm^{-1}$, less than about 5 $cm^{-1}$, less than about 2 $cm^{-1}$, less than about 1 $cm^{-1}$, less than about 0.5 $cm^{-1}$, less than about 0.2 $cm^{-1}$, or less than about 0.1 $cm^{-1}$.

The reused nitride wafer may be incorporated into a semiconductor structure. The semiconductor structure may comprise at least one $Al_xIn_yGa_{(1-x-y)}N$ epitaxial layer, where $0\leq x, y, x+y\leq1$. The epitaxial layer may be deposited on the wafer, for example, by metalorganic chemical vapor deposition (MOCVD) or by molecular beam epitaxy (MBE), according to methods that are known in the art. At least a portion of the semiconductor structure may form a portion of a gallium-nitride-based electronic device or optoelectronic device such as a light emitting diode, a laser diode, a photodetector, an avalanche photodiode, a photovoltaic cell, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, and combinations thereof. The gallium-nitride-based electronic device or optoelectronic device may be incorporated into a fixture such as a luminaire. The gallium-nitride-based electronic device or optoelectronic device, after singulation, may have lateral dimensions of at least 0.1 millimeter by 0.1 millimeter. The gallium-nitride-based electronic or optoelectronic device may have a maximum dimension of at least 8 millimeters and, for example, may comprise a laser diode. The gallium-nitride-based electronic or optoelectronic device may be entirely free of dislocations throughout its volume. For example, at a dislocation density of $10^4$ $cm^{-2}$, a substantial fraction of 0.1×0.1 $mm^2$ devices could be expected to be free of dislocations. At a dislocation density of $10^2$ $cm^{-2}$, a substantial fraction of 1×1 $mm^2$ devices could be expected to be free of dislocations. The gallium-nitride-based electronic or optoelectronic device may be entirely free of stacking faults throughout its volume. For example, at a stacking fault density of 1 $cm^{-1}$, a substantial fraction of 10×1 $mm^2$ stripe-shaped devices such as laser diodes with non-polar or semipolar large area surfaces and c-plane facets, could be expected to be free of stacking faults.

The above sequence of steps provides a method according to an embodiment of the present disclosure. In a specific embodiment, the present disclosure provides a method and resulting crystalline material provided by a high pressure apparatus having structured support members. Other alternatives can also be provided where steps are added, one or more steps are removed, or one or more steps are provided in a different sequence without departing from the scope of the claims herein.

EXAMPLES

Embodiments provided by the present disclosure are further illustrated by reference to the following examples, which describe the fabrication of certain devices provided by the present disclosure. It will be apparent to those skilled in the art that many modifications, both to materials, and methods, may be practiced without departing from the scope of the disclosure.

Example 1

An epitaxial LED device layer, comprising an n-type layer, an InGaN active layer, and a p-type later, is deposited on an HVPE-grown wafer by MOCVD, with a total thickness of approximately 4 micrometers. A nickel-based stressor layer is deposited overlying the device layer, and a flexible handle layer is cemented onto the stressor layer. A vertical load is applied to the flexible handle layer, causing spalling of the epitaxial LED device layer plus approximately 40 micrometers of the original substrate.

The spalled wafer is broken into two pieces. For the first of the two pieces, the spalled surface of the GaN wafer is lapped, polished, dry-etched, and chemical-mechanically polished, while the second half-wafer is left in the as-spalled condition. Both pieces are then fastened to a rigid seed rack and inserted into a silver capsule along with a 13.4% open area baffle, polycrystalline GaN nutrient, NH4F mineralizer, and ammonia, and the capsule is sealed. The ratios of GaN nutrient and NH4F mineralizer to ammonia are approximately 1.02 and 0.048, respectively, by weight. The capsule is placed in an internally-heated high pressure apparatus and heated to temperatures of approximately 650 degrees Celsius for the upper, nutrient zone and approximately 690 degrees Celsius for the lower, crystal growth zone, maintained at these temperatures for approximately 12 hours, and then cooled and removed. Ammonothermal GaN grows on the as-spalled and planarized surfaces of the two pieces of the spalled wafer to a thickness of approximately 60 micrometers. Each of the wafers is then lapped at an angle of approximately 5 degrees with respect to the large-area surfaces until a portion of the regrowth interface is exposed. The location of the regrowth interface between the original HVPE-grown GaN and the ammonothermally-grown GaN is visualized by scanning electron microscopy (SEM). The regrowth interface itself is characterized by a higher secondary electron yield, and hence a higher apparent brightness, than the material on either side, even though the material on each side of the regrowth interface and the regrowth interface itself constitute GaN with the same structure and very nearly the same composition.

Secondary ion mass spectrometry (SIMS) analysis is performed just to the side of the exposed regrowth interface and the composition of approximately 10 micrometers of the ammonothermally regrown layer, the regrowth interface itself, and approximately 10 micrometers of the original substrate are determined by sputtering a crater though the regrowth interface. In a five-micrometer-thick layer on the regrown side of the regrowth interface, the average concentrations of oxygen and hydrogen are $1\times10^{17}$ $cm^{-3}$ and $5\times10^{17}$ $cm^{-3}$, respectively. In a five-micrometer-thick layer centered at the regrowth interface, the average concentrations of oxygen and hydrogen are $2\times10^{17}$ $cm^{-3}$ and $9\times10^{17}$ $cm^{-3}$, respectively. In a five-micrometer-thick layer on the substrate side of the regrowth interface, the average concentrations of oxygen and hydrogen are $0.8\times10^{17}$ $cm^{-3}$ and $2\times10^{17}$ $cm^{-3}$, respectively. The concentration of oxygen in the regrowth interface is higher by approximately a factor of 2.2 and a factor of 2.6, respectively, than the averages of the values in the substrate and in the regrown layer, and the concentrations of oxygen and hydrogen are within about 20% and about 60% between the regrown layer and the substrate.

While the above is a full description of the specific embodiments, various modifications, alternative constructions, and equivalents may be used. Therefore, the above description and illustrations should not be taken as limiting the scope of the present disclosure which is defined by the appended claims.

What is claimed is:

1. A method [for re-using] *of preparing* a used crystalline nitride wafer [from which a layer has been removed] *for a regrowth process*, said used crystalline nitride wafer having [a diameter greater than about 25 millimeters and] a thickness between about 100 micrometers and about 10 millimeters, a substantially wurtzite structure, [a first surface from which said layer was removed, said] *a* first surface having a root-mean-square surface roughness greater than about 10 nanometers measured over an area of 20 micrometers by 20 micrometers[;], and a second surface opposite said first surface and having a root-mean-square surface roughness less than about 10 micrometers measured over an area of at least 20 micrometers by 20 micrometers, said method comprising:

preparing at least one of said first surface and said second surface for re-growth to form a planarized substrate;

performing bulk crystal growth on said planarized substrate to form a regrown wafer; and preparing a regrowth surface[on said regrown wafer to an epi-ready state], said regrowth surface having a surface threading dislocation density less than about $10^7$ $cm^{-2}$, a stacking-fault concentration below about $10^2$ $cm^{-1}$, and a symmetric x-ray rocking curve full width at half maximum (FWHM) less than about 100 arcsec, and a root-mean-square surface roughness less than about 0.5 nanometers measured over an area of 20 micrometers by 20 micrometers.

2. The method of claim 1, wherein preparing at least one of said first surface and said second surface for re-growth comprises at least one of grinding, lapping, polishing, dry etching, wet etching, and chemical-mechanical polishing.

3. The method of claim 2, wherein preparing at least one of said first surface and said second surface for re-growth comprises removal of a residual device layer.

4. The method of claim 1, wherein said [first surface is prepared for regrowth and said] bulk crystal growth is performed on [that] *said first* surface.

5. The method of claim 1, wherein said [second surface is prepared for regrowth and said] bulk crystal growth is performed on [that] *the second* surface.

6. The method of claim 1, wherein bulk crystal growth on said planarized substrate is performed by at least one of hydride vapor phase epitaxy, metalorganic chemical vapor deposition, molecular beam epitaxy, ammonothermal growth, or flux growth.

7. The method of claim 1, wherein said bulk crystal growth is performed with at least a second used wafer having a second planarized substrate, wherein said planarized substrate is positioned back-to-back with said second planarized substrate with a separation of less than 3 millimeters.

8. The method of claim 1, wherein said regrowth surface is prepared by at least one of grinding, lapping, polishing, dry etching, wet etching, and chemical-mechanical polishing.

9. The method of claim 1, further comprising performing one or more of edge-grinding, beveling, or flat-grinding to said regrown wafer.

10. The method of claim 1, further comprising heating said regrown wafer to a temperature between 800 degrees Celsius and 1100 degrees Celsius for a time between 30 minutes and 10 hours in an atmosphere comprising at least one of ammonia, hydrogen, and nitrogen at a pressure between 100 Torr and 1000 Torr.

11. The method of claim 1, wherein said regrowth surface has a crystallographic orientation within 5 degrees[, within 2 degrees, within 1 degree, within 0.5 degree, within 0.2 degree, within 0.1 degree, within 0.05 degree, within 0.02 degree, or within 0.01 degree] of (0001)+c-plane, (000-1) −c-plane, {10-10} m-plane, {11-20} a-plane, [{11-2.+−.2}, {30-3.+−.1}, {20-2.+−.1}, {30-3.+−.2}, {10-1.+−.1}, or {10-1.+−.2}] *{11-2±2}, {30-3±1}, {20-2±1}, {30-3±2}, {10-1±1}, or {10-1±2}*.

12. The method of claim 11, wherein said regrowth surface has a crystallographic orientation that is miscut from the (0001)+c-plane by between about 0.2 degrees and about 1 degree toward a <10-10>m-direction and by less than 1 degree toward an orthogonal <11-20>a-direction.

13. The method of claim 1, wherein said regrown wafer has a total thickness variation (TTV) of less than about 10 micrometers and by a macroscopic bow that is less than about 100 micrometers.

14. The method of claim 1, wherein said regrown wafer has a variation in a miscut angle across said regrowth surface that is less than about 2 degrees in each of two orthogonal crystallographic directions.

15. The method of claim 1, wherein said regrowth surface has an edge perimeter that is substantially round, with at least one orientation flat.

16. The method of claim 1, wherein *preparing the used crystalline nitride wafer for the re-growth process further comprises removing a layer from the first surface before preparing the at least one of the first surface and the second surface for re-growth, and* said layer is removed *from the first surface* by spalling.

*17. The method of claim 1, wherein the first surface has a maximum dimension between 5 millimeters and 600 millimeters, and a minimum dimension between 1 millimeter and 600 millimeters.*

*18. The method of claim 1, wherein the first surface has a diameter greater than about 25 millimeters.*

*19. The method of claim 1, wherein preparing the regrowth surface comprises preparing the regrowth surface on the regrown wafer to an epi-ready state.*

*20. The method of claim 1, wherein a distance between a regrowth interface on which the bulk crystal growth is performed and the regrowth surface is at least 10 micrometers.*

*21. The method of claim 1, wherein the regrowth surface has a surface threading dislocation density less than about $10^5$ cm $^{-2}$, a stacking-fault concentration below about 10 $cm^{-1}$, and a symmetric x-ray rocking curve full width at half maximum (FWHM) less than about 50 arcsec, and a root-mean-square surface roughness less than about 0.2 nanometers measured over an area of 20 micrometers by 20 micrometers.*

*22. The method of claim 1, wherein the regrowth surface is characterized by a crystallographic radius of curvature greater than about 10 meters in at least two independent directions.*

*23. The method of claim 1, wherein the regrown wafer has a variation in a miscut angle across the regrowth surface that is less than about 0.2 degrees in each of two orthogonal crystallographic directions.*

*24. A method for re-using a used crystalline nitride wafer from which a layer has been removed, the used crystalline nitride wafer having a thickness between about 100 micrometers and about 10 millimeters, a substantially wurtzite structure, a first surface from which the layer was removed, the first surface having a root-mean-square surface roughness greater than about 10 nanometers measured over an area of 20 micrometers by 20 micrometers; and a second surface opposite the first surface and having a root-mean-square surface roughness less than about 10 micrometers measured over an area of at least 20 micrometers by 20 micrometers, the method comprising:*

*preparing at least one of the first surface and the second surface for re-growth to form a planarized substrate;*

*performing bulk crystal growth on the planarized substrate to form a regrown wafer; and*

*preparing a regrowth surface on the regrown wafer to an epi-ready state, the regrowth surface having a surface threading dislocation density less than about $10^7$ cm $^{-2}$, a stacking-fault concentration below about $10^2$ $cm^{-1}$, and a symmetric x-ray rocking curve full width at half maximum (FWHM) less than about 100 arcsec, and a root-mean-square surface roughness less than about 0.5 nanometers measured over an area of 20 micrometers by 20 micrometers.*

* * * * *